US012622184B2

(12) United States Patent
Wang et al.

(10) Patent No.: US 12,622,184 B2
(45) Date of Patent: May 5, 2026

(54) RESISTIVE SWITCHING DEVICE AND FABRICATION METHOD THEREOF

(71) Applicant: UNITED MICROELECTRONICS CORP., Hsin-Chu City (TW)

(72) Inventors: Wen-Jen Wang, Tainan City (TW); Yu-Huan Yeh, Hsinchu City (TW); Chuan-Fu Wang, Miaoli County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 374 days.

(21) Appl. No.: 18/219,717

(22) Filed: Jul. 10, 2023

(65) Prior Publication Data

US 2024/0407274 A1     Dec. 5, 2024

(30) Foreign Application Priority Data

Jun. 5, 2023     (TW) ................................. 112120825

(51) Int. Cl.
H10N 70/00     (2023.01)
H10B 63/00     (2023.01)
H10N 70/20     (2023.01)

(52) U.S. Cl.
CPC ......... H10N 70/8418 (2023.02); H10B 63/00 (2023.02); H10N 70/011 (2023.02); H10N

70/24 (2023.02); H10N 70/8265 (2023.02); H10N 70/8833 (2023.02)

(58) Field of Classification Search
CPC .. H10N 70/8418; H10N 70/011; H10N 70/24; H10N 70/8265; H10N 70/8833; H10N 70/20; H10N 70/826; H10N 70/841; H10N 70/801; H10B 63/00; H01L 23/481
See application file for complete search history.

(56) References Cited

U.S. PATENT DOCUMENTS

| | | | | |
|---|---|---|---|---|
| 10,658,586 B2 * | 5/2020 | Clarke | ................. | H10N 70/026 |
| 11,502,254 B2 * | 11/2022 | Strutt | .................. | H10N 70/023 |
| 2022/0069207 A1 * | 3/2022 | McCrate | ................ | H10N 70/20 |
| 2025/0194442 A1 * | 6/2025 | Sung | .................... | H10N 70/826 |

* cited by examiner

*Primary Examiner* — Allison Bernstein
(74) *Attorney, Agent, or Firm* — Winston Hsu

(57) ABSTRACT

A resistive switching device includes a substrate; a first dielectric layer on the substrate; a conductive via in the first dielectric layer; a bottom electrode on the conductive via and the first dielectric layer, a resistive switching layer on the bottom electrode; and a cone-shaped top electrode on the resistive switching layer. The cone-shaped top electrode can produce increased and concentrated electric field during operation, which facilitates the filament forming process.

20 Claims, 8 Drawing Sheets

RESISTIVE SWITCHING DEVICE AND FABRICATION METHOD THEREOF

BACKGROUND OF THE INVENTION

1. Field of the Invention

The invention relates to the field of semiconductor technology, in particular to a resistive switching device and a manufacturing method thereof.

2. Description of the Prior Art

Resistive Random Access Memory (RRAM) is the general name for reprogrammable devices that can be set in a low-resistance or high-resistance state. RRAM typically consists of a dielectric layer disposed between two electrodes. Certain types of RRAM conduct by forming filaments in confined areas of the dielectric. Other types of RRAM can conduct by changing their properties across the dielectric region.

RAM stores information by using the variable resistance properties of the dielectric layer between two electrodes. This dielectric layer, which acts as a resistive layer, is usually insulating, but can be made conductive by filaments or conductive paths formed (i.e., by a forming process) after application of a sufficiently high voltage. The formation of conductive paths may arise from different mechanisms, including defects, metal migration, etc. Once formed, filaments can still be reset (i.e. break, resulting in high resistance) or set (i.e. re-form, resulting in low resistance) by applying an appropriate voltage.

The current RRAM structure is usually a vertical configuration with a single transistor and a single resistor. Due to the large current required, the size of the memory unit will be affected by the transistor. In addition, the filaments or conductive paths formed in the resistive switching layer of the RRAM structure are relatively fragile, and are easy to disappear in the harsher test environment in the subsequent baking process.

SUMMARY OF THE INVENTION

It is one object of the present invention to provide an improved resistive switching device and a manufacturing method thereof, in order to solve the deficiencies or shortcomings of the prior art.

One aspect of the invention provides a resistive switching device including a substrate; a first dielectric layer on the substrate; a conductive via in the first dielectric layer; a bottom electrode on the conductive via and the first dielectric layer; a resistive switching layer on the bottom electrode; and a cone-shaped top electrode on the resistive switching layer.

According to some embodiments, the conductive via comprises tungsten.

According to some embodiments, the bottom electrode comprises TaN, TiN, Pt, Ir, Ru, or W.

According to some embodiments, the cone-shaped top electrode comprises TiN, TaN, Pt, Ir, or W.

According to some embodiments, the bottom electrode comprises TaN and the cone-shaped top electrode comprises TiN.

According to some embodiments, the bottom electrode comprises a recessed sidewall.

According to some embodiments, a width of the resistive switching layer is greater than a width of the bottom electrode.

According to some embodiments, a width of the resistive switching layer is greater than a bottom width of the cone-shaped top electrode.

According to some embodiments, the resistive switching device further includes a spacer layer covering the cone-shaped top electrode, a sidewall of the resistive switching layer, the recessed sidewall of the bottom electrode, and a top surface of the first dielectric layer; a second dielectric layer on the spacer layer; and a contact penetrating through the second dielectric layer and the spacer layer and being electrically connected with the cone-shaped top electrode.

According to some embodiments, the resistive switching layer comprises a hafnium oxide layer and a titanium layer.

Another aspect of the invention provides a method for forming a resistive switching device. A substrate is provided. A first dielectric layer is formed on the substrate. A conductive via is formed in the first dielectric layer. A bottom electrode is formed on the conductive via and the first dielectric layer. A resistive switching layer is formed on the bottom electrode. A cone-shaped top electrode is formed on the resistive switching layer.

According to some embodiments, the conductive via comprises tungsten.

According to some embodiments, the bottom electrode comprises TaN, TiN, Pt, Ir, Ru, or W.

According to some embodiments, the cone-shaped top electrode comprises TiN, TaN, Pt, Ir, or W.

According to some embodiments, the bottom electrode comprises TaN and the cone-shaped top electrode comprises TiN.

According to some embodiments, the bottom electrode comprises a recessed sidewall.

According to some embodiments, a width of the resistive switching layer is greater than a width of the bottom electrode.

According to some embodiments, a width of the resistive switching layer is greater than a bottom width of the cone-shaped top electrode.

According to some embodiments, the method further include the steps of forming a spacer layer covering the cone-shaped top electrode, a sidewall of the resistive switching layer, the recessed sidewall of the bottom electrode, and a top surface of the first dielectric layer; forming a second dielectric layer on the spacer layer; and forming a contact penetrating through the second dielectric layer and the spacer layer and being electrically connected with the cone-shaped top electrode.

According to some embodiments, the resistive switching layer comprises a hafnium oxide layer and a titanium layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
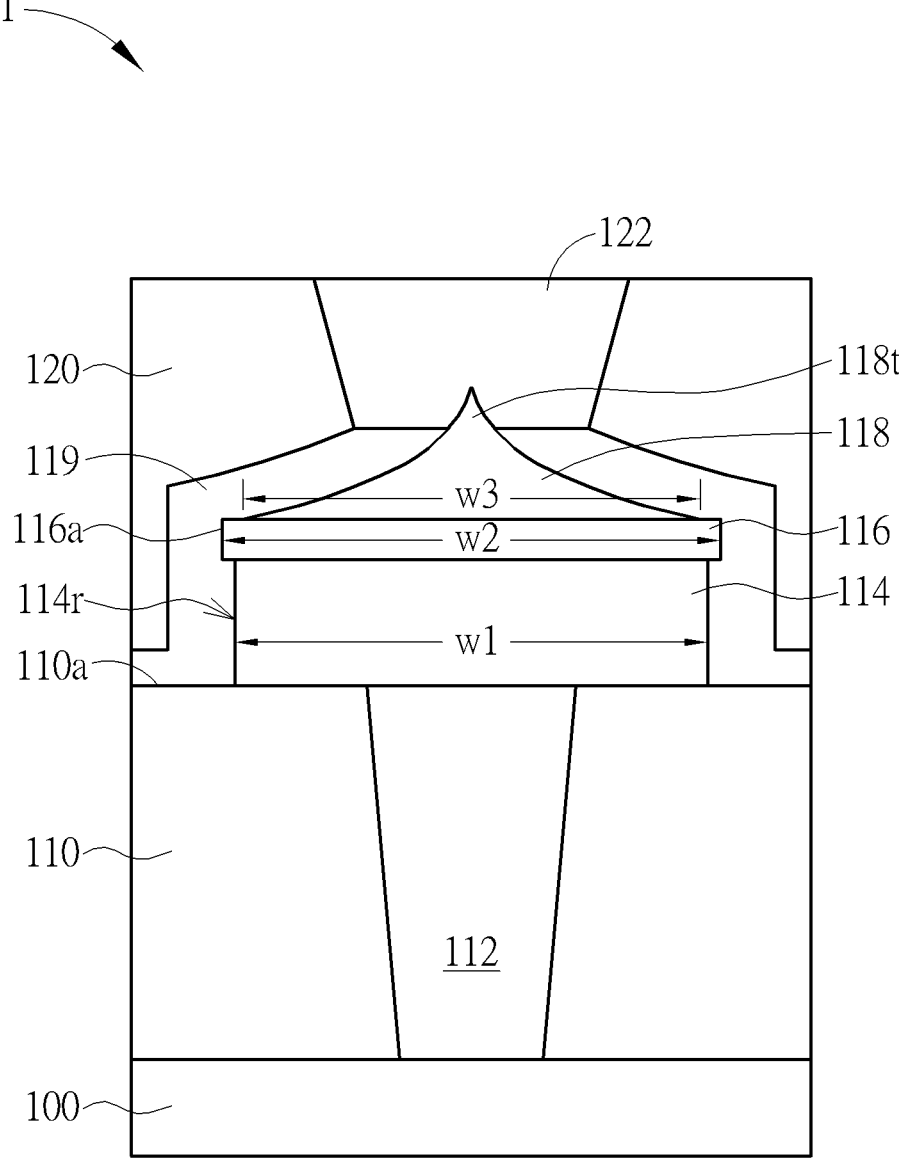
FIG. 1 is a schematic cross-sectional view of a resistive switching device according to an embodiment of the present invention.

FIG. 1 is a schematic cross-sectional view of a resistive switching device according to an embodiment of the present invention. As shown in FIG. 1, a resistive switching device 1, for example, a resistive nonvolatile random access memory (RRAM), includes a substrate 100, a first dielectric layer 110 located on the substrate 100, a conductive via 112 in the first dielectric layer 110, a bottom electrode 114 on the conductive via 112 and the first dielectric layer 110, a resistive switching layer 116 on the bottom electrode 114, and a cone-shaped top electrode 118 on the resistive switching layer 116.

According to an embodiment of the present invention, the substrate 100 may include, for example, a silicon substrate, but is not limited thereto. According to an embodiment of the present invention, various circuit elements, such as transistors, etc. may be formed on the substrate 100, which are not shown in the figure for the sake of simplicity. According to an embodiment of the present invention, the first dielectric layer 110 may include a silicon oxide layer, but is not limited thereto. According to an embodiment of the present invention, the conductive via 112 may include tungsten, but is not limited thereto. According to an embodiment of the present invention, the conductive via 112 may be a tungsten via.

According to an embodiment of the present invention, the bottom electrode 114 may include TaN, TiN, Pt, Ir, Ru or W, but is not limited thereto. According to an embodiment of the present invention, the cone-shaped top electrode 118 may include TIN, TaN, Pt, Ir or W, but is not limited thereto. According to an embodiment of the invention, for example, the bottom electrode 114 comprises TaN and the cone-shaped top electrode 118 comprises TIN. According to an embodiment of the present invention, for example, resistive switching layer 116 may include a hafnium oxide ($HfO_2$) layer and a titanium (Ti) layer, but is not limited thereto.

According to an embodiment of the invention, the bottom electrode 114 includes a recessed sidewall 114r. According to an embodiment of the invention, the width w2 of the resistive switching layer 116 is greater than the width w1 of the bottom electrode 114. According to an embodiment of the invention, the peripheral edge of the resistive switching layer 116 forms overhang on the recessed sidewall 114r of the bottom electrode 114. According to an embodiment of the present invention, the width w2 of the resistive switching layer 116 is greater than the bottom width w3 of the cone-shaped top electrode 118.

According to an embodiment of the present invention, the resistive switching device 1 further includes a spacer layer 119 covering the cone-shaped top electrode 118, the sidewall 116a of the resistive switching layer 116, the recessed sidewall 114r of the bottom electrode 114 and the top surface 110a of the first dielectric layer 110. According to an embodiment of the present invention, the spacer layer 119 may include silicon nitride, but is not limited thereto.

According to an embodiment of the present invention, the resistive switching device 1 further includes a second dielectric layer 120 located on the spacer layer 119. According to an embodiment of the present invention, for example, the second dielectric layer 120 may include a low dielectric constant material, but is not limited thereto. According to an embodiment of the present invention, the resistive switching device 1 further includes a contact 122 penetrating through the second dielectric layer 120 and the spacer layer 119. The contact 122 is electrically connected to the cone-shaped top electrode 118. According to an embodiment of the present invention, the tip 118t of the cone-shaped top electrode 118 may protrude from the upper surface of the spacer layer 119 and may extend into the bottom of the contact 122.

The resistive switching device 1 of the present invention has a special cone-shaped top electrode 118, such that a larger and more concentrated electric field can be generated between the bottom electrode 114 and the cone-shaped top electrode 118 during operation, which is beneficial to the forming process of filaments or conductive paths. In addition, the filaments or conductive paths formed in the resistive switching layer 116 are relatively strong, and are not easy to disappear in the harsh test environment in the subsequent baking process.

Figure 2:
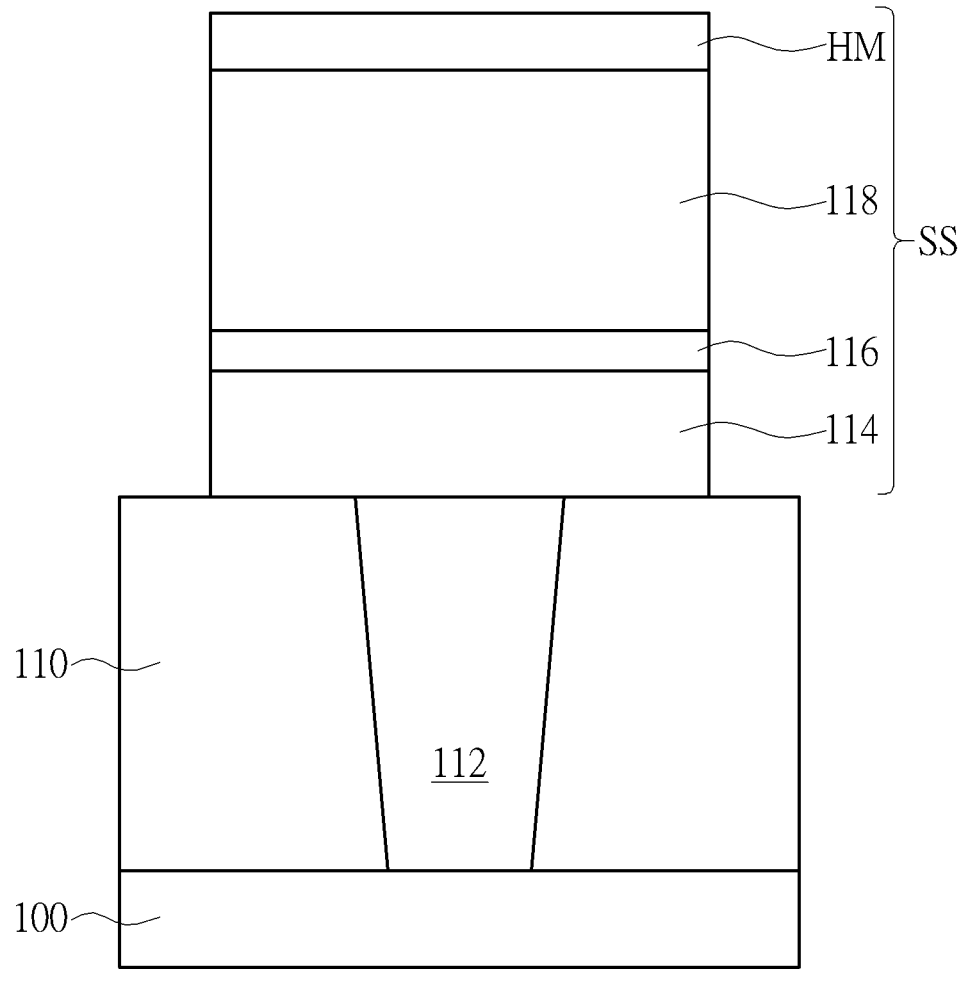
FIG. 2 to FIG. 8 illustrate an exemplary method of forming a resistive switching device.

FIG. 2 to FIG. 8 illustrate an exemplary method of forming a resistive switching device. First, as shown in FIG. 2, a substrate 100 is provided. According to an embodiment of the present invention, the substrate 100 may include, for example, a silicon substrate, but is not limited thereto. According to an embodiment of the present invention, various circuit elements, such as transistors, etc. may be formed on the substrate 100, which are not shown in the figure for the sake of simplicity.

Subsequently, a first dielectric layer 110 is formed on the substrate 100. According to an embodiment of the present invention, the first dielectric layer 110 may include a silicon oxide layer, but is not limited thereto. A conductive via 112 is then formed in the first dielectric layer 110. According to an embodiment of the present invention, the conductive via 112 may include tungsten, but is not limited thereto. According to an embodiment of the present invention, the conductive via 112 may be a tungsten via.

A patterned stack structure SS is formed on the conductive via 112 and the first dielectric layer 110. The stack structure SS may include a bottom electrode 114; a resistive switching layer 116 on the bottom electrode 114, a top electrode 118 on the resistive switching layer 116, and a hard mask layer HM on the top electrode 118. According to an embodiment of the present invention, the stack structure SS can be formed by various processes including, but not limited to, lithography and etching.

According to an embodiment of the present invention, the bottom electrode 114 may include TaN, TiN, Pt, Ir, Ru or W, but is not limited thereto. According to an embodiment of the present invention, the top electrode 118 may include TiN, TaN, Pt, Ir or W, but is not limited thereto. According to an embodiment of the present invention, for example, the bottom electrode 114 comprises TaN and the top electrode 118 comprises TiN. According to an embodiment of the present invention, for example, the resistive switching layer 116 may include a hafnium oxide ($HfO_2$) layer and a titanium (Ti) layer, but is not limited thereto. According to an embodiment of the present invention, for example, the hard mask layer HM may include silicon nitride.

Figure 3:
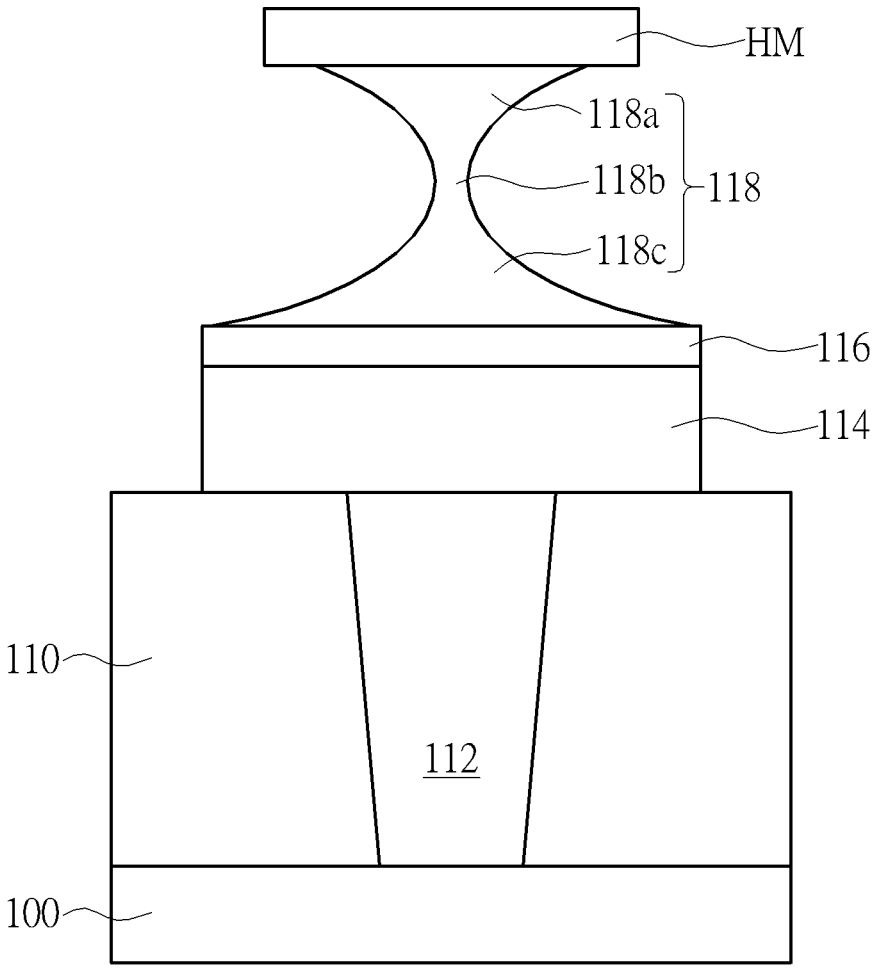

As shown in FIG. 3, a wet etching process is then performed to selectively etch the top electrode 118 laterally so that the top electrode 118 is etched into an hourglass-like profile with a wider top and bottom and a thinner neck in the middle. At this point, the top electrode 118 has an upper portion 118a, a neck portion 118b, and a bottom portion 118c.

An etchant that only etches the top electrode 118 and substantially does not etch the hard mask layer HM and the resistive switching layer 116 may be selected in the above wet etching process. According to an embodiment of the present invention, the above-mentioned etchant also has different etching rates for the top electrode 118 and the bottom electrode 114. For example, the etching rate of the above-mentioned etchant for the top electrode 118 is higher than that for the bottom electrode 114.

Figure 4:
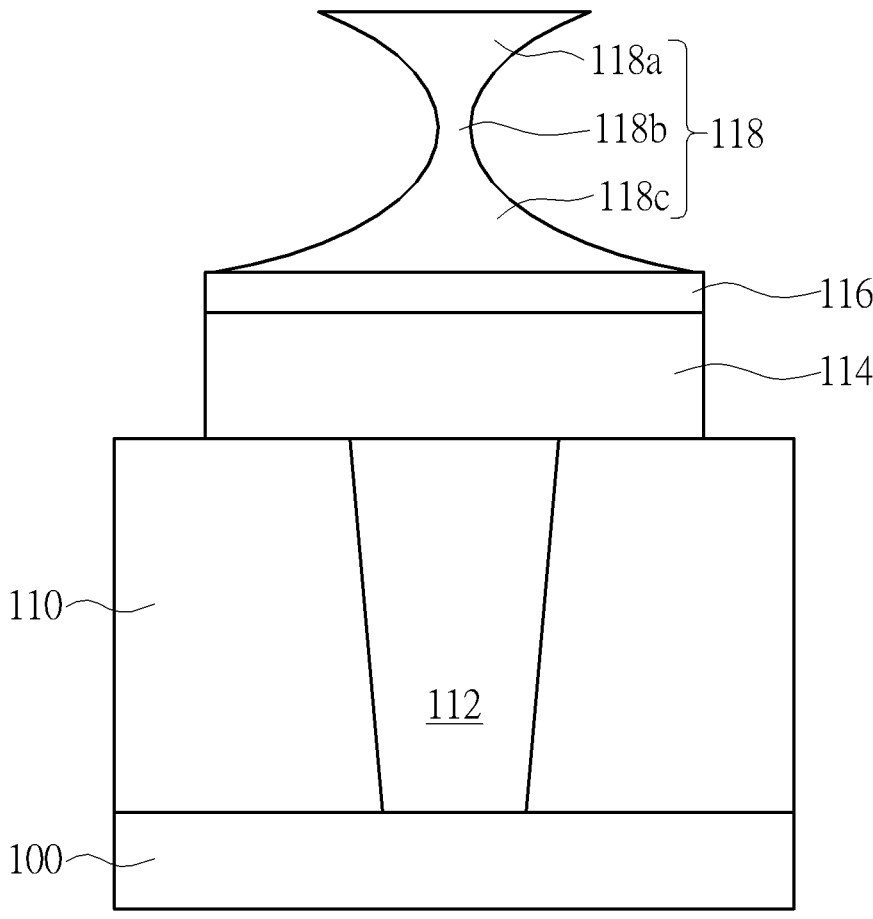

As shown in FIG. 4, subsequently, an etching process, such as a wet etching process, may be used to selectively etch away the hard mask layer HM so as to expose the top surface of the top electrode 118.

Figure 5:
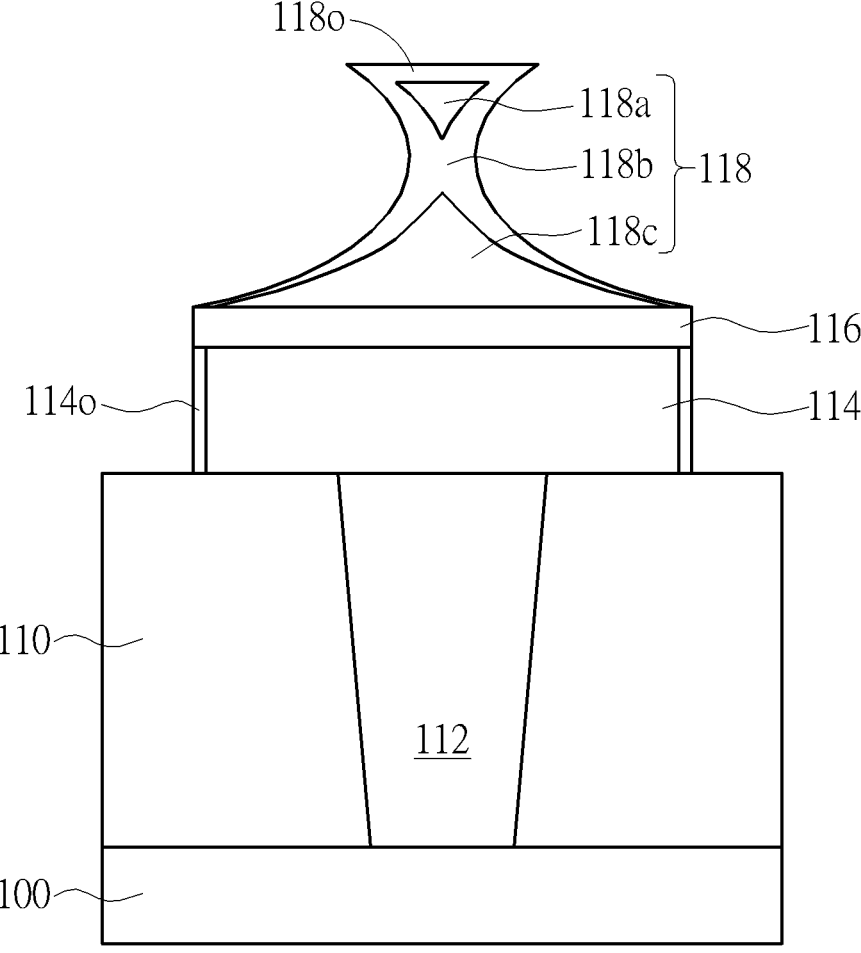

As shown in FIG. 5, an oxidation process is then performed to oxidize the surface of the top electrode 118 with a predetermined thickness to form an oxide layer 1180. At this point, the neck portion 118b of the top electrode 118 is completely oxidized into the oxide layer 1180. According to an embodiment of the present invention, the sidewall surface of the bottom electrode 114 may also be oxidized simultaneously to form an oxide layer 1140.

Figure 6:
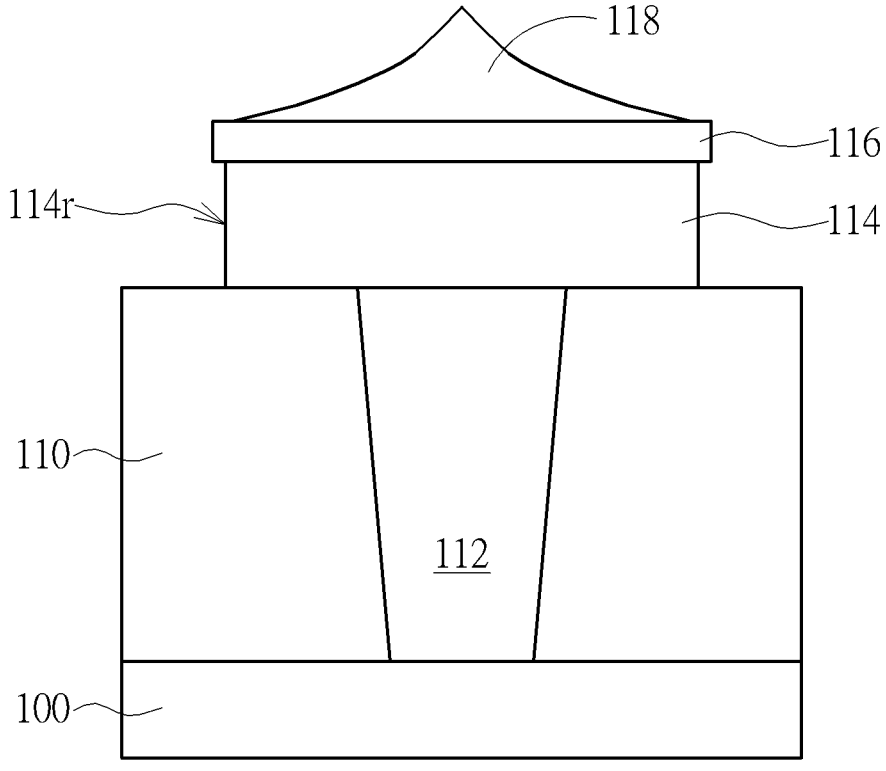

As shown in FIG. 6, subsequently, an oxide removal process is performed, and the oxide layer 1180 and the oxide layer 1140 are selectively removed by etching, such as wet etching, to form a cone-shaped top electrode 118 and a bottom electrode 114 with recessed sidewall 114r. At this point, the width of the resistive switching layer 116 is greater than the width of the bottom electrode 114, and the width of the resistive switching layer 116 is greater than the width of the bottom width of the cone-shaped top electrode 118.

Figure 7:
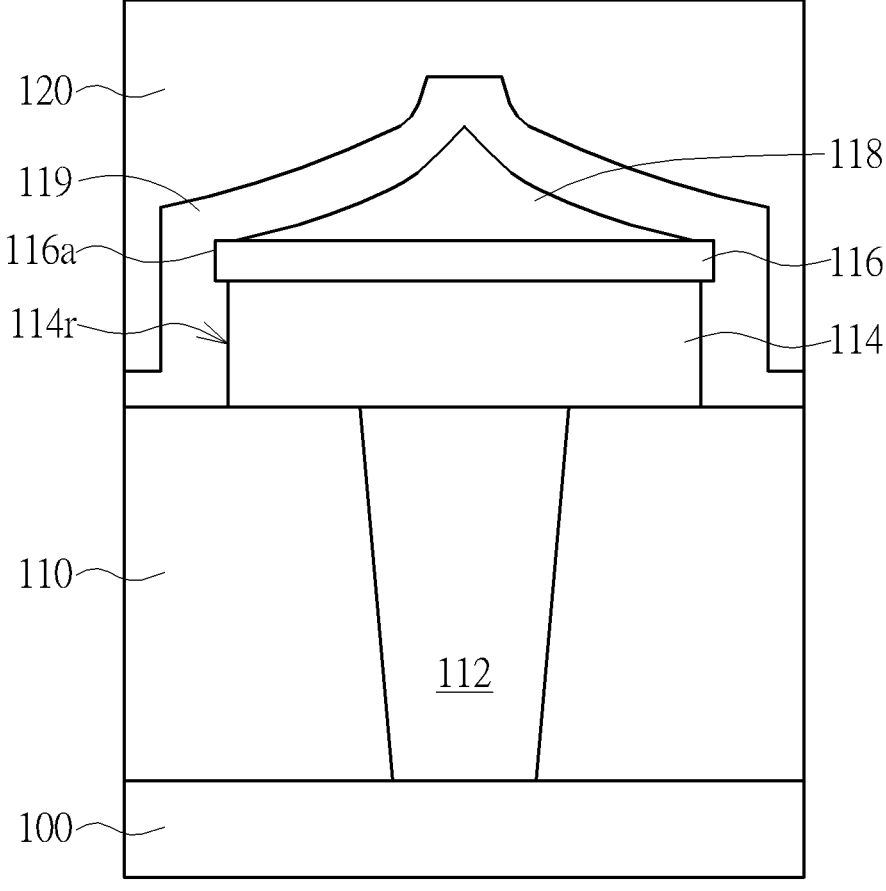

As shown in FIG. 7, subsequently, a spacer layer 119 is deposited to conformally cover the cone-shaped top electrode 118, the sidewall 116a of the resistive switching layer 116, the recessed sidewall 114r of the bottom electrode 114, and the top surface 110a of the first dielectric layer 110. A second dielectric layer 120 is then formed on the spacer layer 119. According to an embodiment of the present invention, for example, the second dielectric layer 120 may include a low dielectric constant material, but is not limited thereto.

Figure 8:
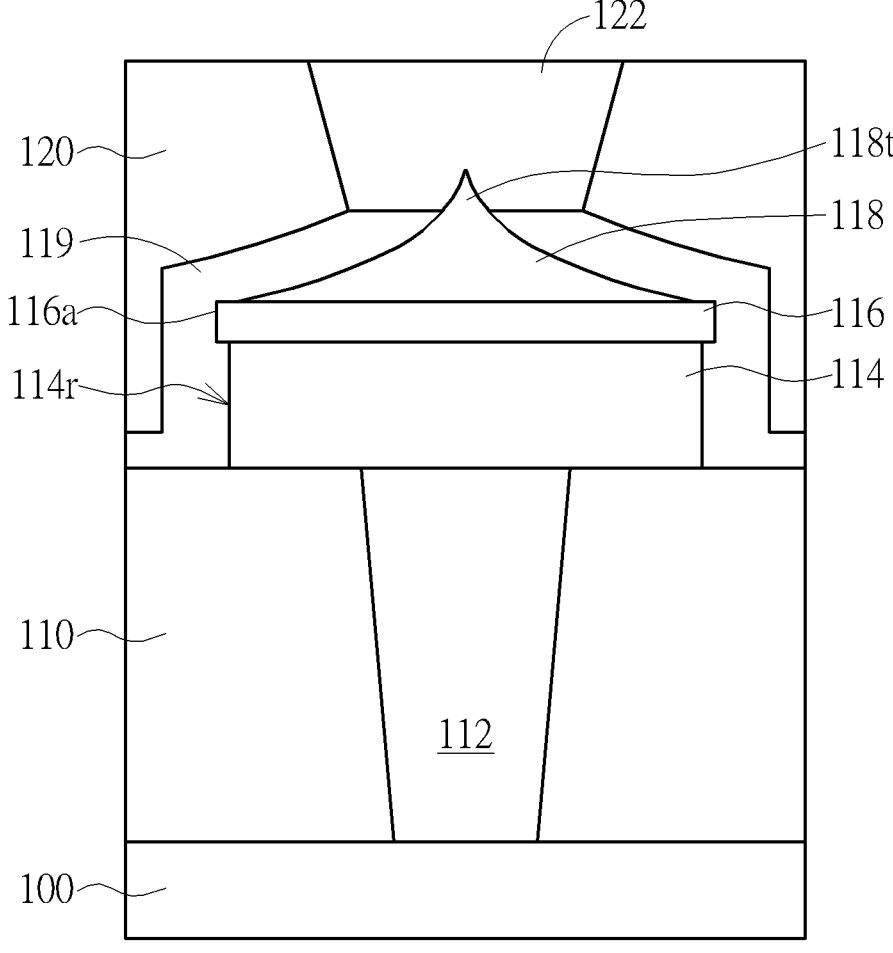

Finally, as shown in FIG. 8, a contact 122 is formed, penetrating through the second dielectric layer 120 and the spacer layer 119, and electrically connecting the cone-shaped top electrode 118. According to an embodiment of the present invention, for example, the contact 122 may include copper, but is not limited thereto. According to an embodiment of the present invention, the tip 118t of the cone-shaped top electrode 118 may protrude from the upper surface of the spacer layer 119 and may extend into the bottom of the contact 122.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive switching device, comprising:
a substrate;
a first dielectric layer on the substrate;
a conductive via in the first dielectric layer;
a bottom electrode on the conductive via and the first dielectric layer;

a resistive switching layer on the bottom electrode; and
a cone-shaped top electrode on the resistive switching layer and comprising a tip, wherein a bottom width of the cone-shaped top electrode is wider than a width of the tip.

2. The resistive switching device according to claim 1, wherein the conductive via comprises tungsten.

3. The resistive switching device according to claim 1, further comprising a spacer layer covering the cone-shaped top electrode, wherein the pointed tip of the cone-shaped top electrode protrudes from an upper surface of the spacer layer.

4. The resistive switching device according to claim 3, wherein the spacer layer further covers a sidewall of the resistive switching layer and a top surface of the first dielectric layer.

5. The resistive switching device according to claim 3 further comprising:
a second dielectric layer on the spacer layer; and
a contact penetrating through the second dielectric layer and the spacer layer and being electrically connected with the cone-shaped top electrode.

6. The resistive switching device according to claim 1, wherein the bottom electrode comprises TaN and the cone-shaped top electrode comprises TiN.

7. The resistive switching device according to claim 1, wherein the bottom electrode comprises a recessed sidewall.

8. The resistive switching device according to claim 7, wherein the spacer layer covering the recessed sidewall of the bottom electrode.

9. The resistive switching device according to claim 1, wherein a bottom width of the resistive switching layer connecting to the bottom electrode is greater than a bottom width of the bottom electrode away from the resistive switching layer.

10. The resistive switching device according to claim 1, wherein a width of the resistive switching layer is greater than a bottom width of the cone-shaped top electrode.

11. A method for forming a resistive switching device, comprising:
providing a substrate;
forming a first dielectric layer on the substrate;
forming a conductive via in the first dielectric layer;
forming a bottom electrode on the conductive via and the first dielectric layer;
forming a resistive switching layer on the bottom electrode; and
forming a cone-shaped top electrode on the resistive switching layer, wherein the cone-shaped top electrode comprises a tip, and wherein a bottom width of the cone-shaped top electrode is wider than a width of the tip.

12. The method according to claim 11, wherein the conductive via comprises tungsten.

13. The method according to claim 11, further comprising a spacer layer covering the cone-shaped top electrode, wherein the pointed tip of the cone-shaped top electrode protrudes from an upper surface of the spacer layer.

14. The method according to claim 13, wherein the spacer layer further covers a sidewall of the resistive switching layer and a top surface of the first dielectric layer.

15. The method according to claim 13 further comprising:
forming a second dielectric layer on the spacer layer; and
forming a contact penetrating through the second dielectric layer and the spacer layer and being electrically connected with the cone-shaped top electrode.

16. The method according to claim 11, wherein the bottom electrode comprises TaN and the cone-shaped top electrode comprises TiN.

17. The method according to claim 11, wherein the bottom electrode comprises a recessed sidewall.

18. The method according to claim 17, wherein the spacer layer covering the recessed sidewall of the bottom electrode.

19. The method according to claim 11, wherein a bottom width of the resistive switching layer connecting to the bottom electrode is greater than a bottom width of the bottom electrode away from the resistive switching layer.

20. The method according to claim 11, wherein a width of the resistive switching layer is greater than a bottom width of the cone-shaped top electrode.

* * * * *